United States Patent [19]
Halder et al.

[11] 4,434,400
[45] Feb. 28, 1984

[54] CIRCUIT FOR SUPERVISING AN ELECTRONIC ELECTRICITY METER

[75] Inventors: Mathis Halder, Baar; Jakob Widmer, Zug; Jacob De Vries, Allenwinden, all of Switzerland

[73] Assignee: LGZ Landis & Gyr Zug AG, Zug, Switzerland

[21] Appl. No.: 257,915

[22] Filed: Apr. 27, 1981

[30] Foreign Application Priority Data

May 2, 1980 [CH] Switzerland ............ 3427/80

[51] Int. Cl.$^3$ .................. G01R 1/36; G08B 23/00
[52] U.S. Cl. ................................ 324/110; 340/653
[58] Field of Search ............ 324/142, 110; 340/637, 340/653

[56] References Cited

U.S. PATENT DOCUMENTS

| | | | |
|---|---|---|---|
| 3,119,104 | 1/1964 | Bryan | 340/653 |
| 4,188,625 | 2/1980 | Hodemaekers | 340/653 |
| 4,215,340 | 7/1980 | Lejon | 340/653 |
| 4,217,545 | 8/1980 | Kusui et al. | 324/142 |

*Primary Examiner*—Ernest F. Karlsen
*Attorney, Agent, or Firm*—Ernest F. Marmorek

[57] ABSTRACT

In an electronic energy consumption meter using a mark-space amplitude multiplier, including a current-frequency transducer, a first supervisory circuit is coupled to, and supervises the mark-space modulator multiplier, a second supervisory circuit is coupled to, and supervises the current-frequency transducer, and a fault indicator is coupled to the output of each of the supervisory circuits for indicating a fault in the meter.

19 Claims, 5 Drawing Figures

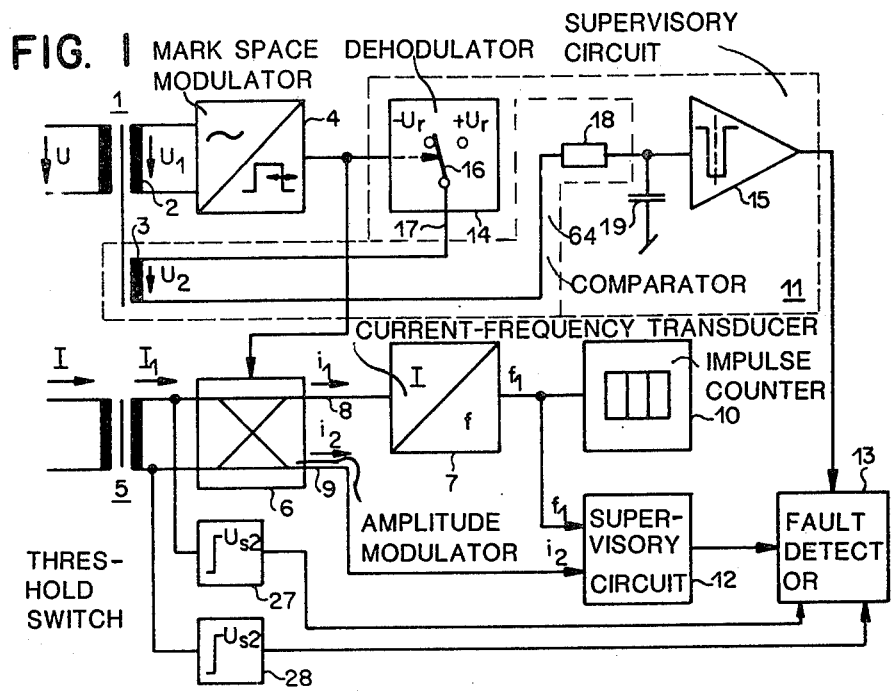
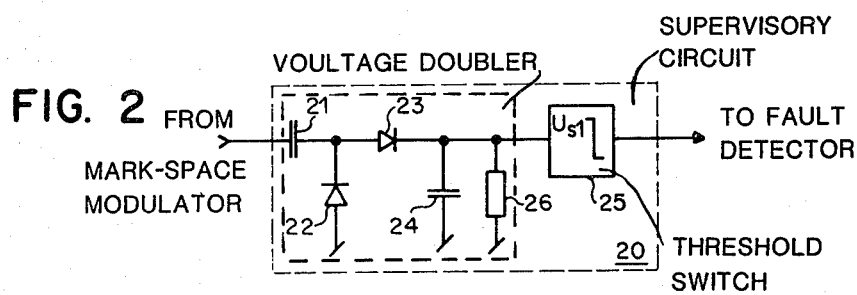
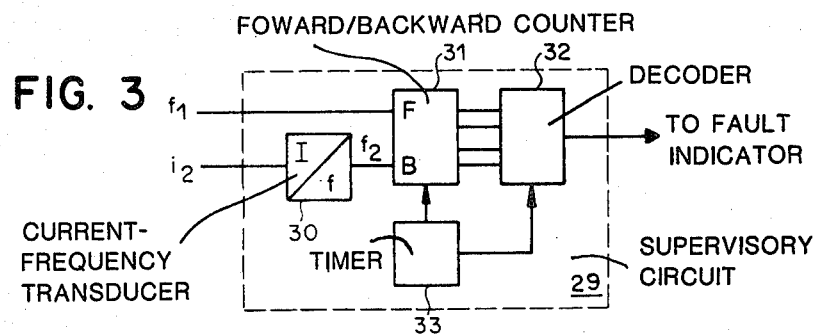

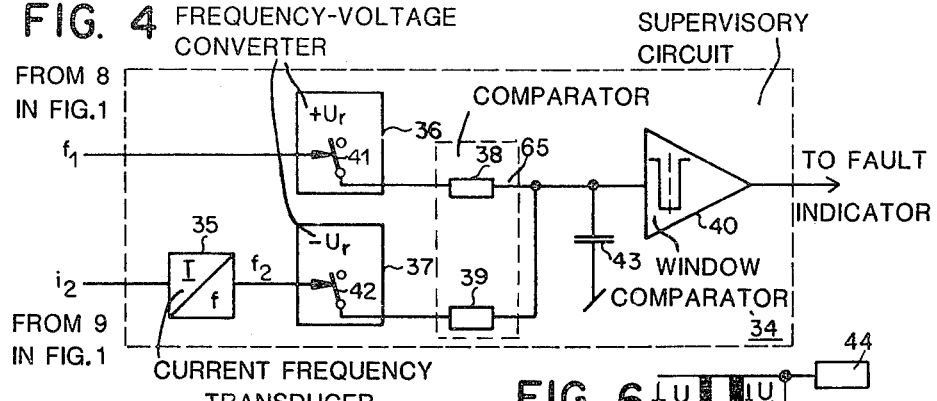
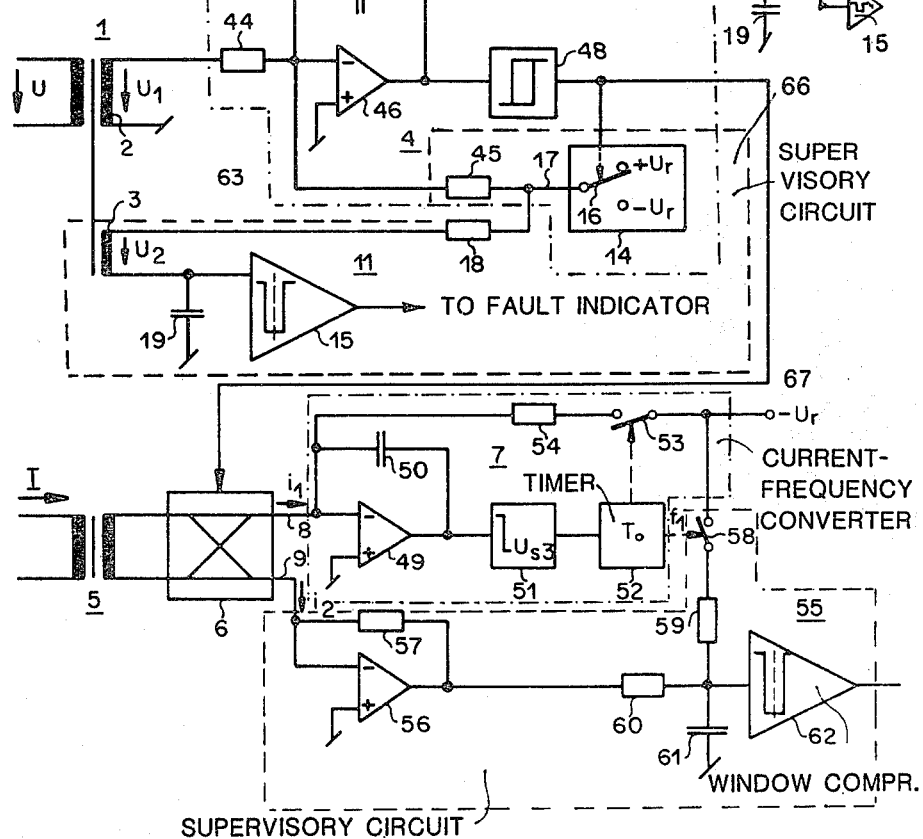

CIRCUIT FOR SUPERVISING AN ELECTRONIC ELECTRICITY METER

BACKGROUND OF THE INVENTION

Electronic or static electricity meters are known, for example from Bull, SEV 62 (1971) 7, pp. 371–377, translated into English in Landis & Gyr review 19 (1972) pp. 9–16. These type of meters have a high precision over a wide range of a load. The use of meters of this type entails a risk however, that a malfunction of one of the electronic elements used in the meter may result in a large measurement error, or could even result in the meter no longer functioning.

From German laid-open patent specification DE-OS 27 38 117 it is known to recognize such errors by feeding reference signals of predetermined amplitude and frequency into the electricity meter, either simultaneously or alternately with the measurement signals, and wherein the product of the reference signals is compared with the actual product obtained from the measurement signals. If the reference signals are processed simultaneously with the measurement signals, then it is expensive to separate the product of the measurement signals from the product of the reference signals. If, however, the reference signals are fed to the meter alternately with the measurement signals, then undesired interruptions of the measurement signals occur. In both of the afore cited cases, as a result of feeding the reference signals directly into the circuit of the electricity meter, the accuracy of measurement may be impaired.

SUMMARY OF THE INVENTION

It is therefore one of the principal objects of the invention to devise a circuit for supervising a static or electronic electricity meter which is simple, does not require any modification of the measurement circuit proper, and may be extended in order to increase its supervising capability according to the respective requirements.

This object is attained in an electronic energy consumption meter using a mark-space amplitude multiplier, and including a current-frequency transducer, by a first supervisory circuit being coupled to, and supervising the mark-space modulator multiplier, by a second supervisory circuit being coupled to, and supervising the current-frequency transducer, and by a fault indicator being coupled to the output of each of the supervisory circuits for indicating a fault in the meter.

Further objects and advantages of the invention will be set forth in part in the following specification, and in part will be obvious therefrom without being specifically referred to, the same being realized and attained as pointed out in the claims hereof.

BRIEF DESCRIPTION OF THE DRAWINGS

For a fuller understanding of the nature and objects of the invention, reference should be had to the following detailed description, taken in connection with the accompanying drawings in which:

FIG. 1 is a circuit schematic of an electronic electricity meter;

FIG. 2 is a first version of a supervisory circuit;

FIG. 3 is another version of a supervisory circuit;

FIG. 4 is still another version of a supervisory circuit;

FIG. 5 is a partial schematic of an electronic electricity meter;

FIG. 6 is a partial schematic of a version of an electronic electricity meter.

DESCRIPTION OF THE PREFERRED EMBODIMENTS

In carrying the invention into effect, there will be seen in FIG. 1 a voltage transformer 1 having two secondary windings 2 and 3, on the output of which there are obtained electrical signals $U_1$ and $U_2$, respectively, proportional to the input voltage U. The signal $U_1$ controls a mark-space modulator 4. The mark-space modulator 4 generates a rectangular signal, in which the ratio of the difference to the sum of the mark duration, and the space duration, respectively, is proportional to the instantaneous value of the voltage U.

The current I to be measured is fed to a current-transformer 5, in the secondary winding of which there flows a current $I_1$ proportional to the current I. The secondary winding of the current transformer 5 is fed to a current-frequency transducer 7 via a polarity switch 6. The polarity switch 6 is controlled by the mark-space modulator 4, so that during the mark periods of the mark-space modulator 4 one terminal of the secondary winding is connected to the output terminal 8 of the polarity switch 6, and the other terminal of the secondary winding is connected to the output terminal 9 of the polarity switch 6, while during the space periods of the mark-space modulator 4 the other terminal of the secondary winding is connected to the output terminal 8 of the polarity switch 6, and the one terminal of the secondary winding is connected to the output terminal 9 of the polarity switch 6. The polarity switch 6 acts as an amplitude modulator, as the amplitudes of the currents $i_1$ or $i_2$ having rectangular waveforms, is proportional to the instantaneous value of the input current I. The mean value of the currents $i_1$ or $i_2$ corresponds to the electrical output.

The output 8 of the polarity switch 6 is fed directly to the input of the current-frequency transducer 7. The current-frequency transducer 7 generates a frequency $f_1$, which is proportional to the output. An impulse counter 10 counts the impulses generated by the current-frequency transducer 7. The count of the impulse counter 10 is a measure of the power consumed.

A supervisory circuit 11 supervising the mark-space modulator 4 of the aforedescribed electricity meter, and a supervisory circuit 12 supervising at least the current-frequency transducer 7 serves to supervise the aforedescribed electricity meter. The supervisory circuits 11 and 12 are connected to a fault indicator 13. The supervisory circuit 11 is activated at least when the mark-space modulator 4, for any reason whatever, stops oscillating. The supervisory circuit 12 supervises at least the functioning and linearity of the current-frequency transducer 7. This ensures that the most likely or important sources of error of the electricity meter are recognized. If one of the supervisory circuits 11 and 12 is activated, then a signal is fed to the fault indicator 13, which indicates this fault, and if necessary, triggers an alarm. The supervisory circuit 11 advantageously also supervises the linearity of the mark-space modulator 4, and the supervisory circuit 12 the operation or functioning of the polarity switch 6.

The supervisory circuit 11 consists in the example shown in FIG. 1, of a demodulator 14 connected to the output of the mark-space modulator 4, at which output there appears a rectangular waveform. It further includes a comparator circuit 64 for comparing the output of the demodulator 14 with the voltage $U_{21}$ and of a window comparator 15 connected to the comparator circuit. A switch 16 acts as a demodulator 14, and is controlled by the rectangular waveshape at the output of the mark-space modulator 4. The demodulator 14, or its switch 16 includes a demodulator output terminal 17, which in one position of the switch 16 is connected to a positive reference voltage source $U_r$, and in the other position to negative reference voltage source $-U_r$. A rectangular waveform appears on the demodulator output 17, whose average value is proportional to the voltage $U_1$, when the mark-space modulator 4 operates free from any faults. The comparator circuit 64 consisting of the secondary winding 3 of the voltage transformer 1, and of a resistor 18, is connected with one of its terminals to the demodulator output 17, and with the other of its terminals to the input of the window comparator 15. This comparator circuit 64 forms the difference between the output signal of the demodulator 14, and the voltage $U_2$. A capacitor 19 is connected between the input of the window comparator 15 and ground, which together with the resistor 18 operates as a filter. A direct-current voltage appears across the capacitor 19, which corresponds to the difference between the average value of the rectangular waveform appearing on the demodulator output 17, and the voltage $U_2$. The direct-current voltage represents an error signal; it is zero when the mark-space modulator operates without any errors. If the mark-space modulator 4 exceeds, however, or falls below a predetermined positive or negative threshold value, respectively, then the window comparator 15 is activated, and the fault indicator 13 indicates a fault.

As mark-space modulators, as a rule, are free from any linearity errors, it is considered sufficient, if the supervisory function is limited to determining whether the mark-space modulator 4 oscillates. For this purpose the supervisory circuit 20 shown in FIG. 2 eminently suited; the circuit 20 may be used in the circuit of FIG. 1 instead of the supervisory circuit 11; the supervisory circuit 20 consists of a capacitor 21 at its input, which is connected to the output of the mark-space modulator 4, and is in turn connected to two diodes 22 and 23, and one capacitor 24, representing together a voltage doubler. A threshold switch 25 supervises the voltage across the capacitor 24.

As long as the mark-space oscillator 4 oscillates, the capacitor 24 is recharged during each positive-going voltage of the rectangular waveform through the capacitor 21, and the diode 23. If the oscillations of the mark-space modulator 4 cease, then the capacitor 24 is discharged via a resistor 26 connected in a parallel therewith. If the voltage across the capacitor 24 falls below the threshold value $U_{s1}$ of the threshold switch 25, then the threshold switch 25 responds, and indicates an error to the fault indicator 13.

In order to supervise the current-frequency transducer 7, the frequency $f_1$ can be compared with the input current $i_1$ of the current-frequency transducer 7 in the supervisory circuit 12. It is advantageous, however, if the polarity switch 6 is included in the supervision, and if in the supervising circuit 12 a frequency $f_1$, or a value derived therefrom, is compared with the current $i_2$ flowing through the output terminal 9 of the polarity switch 6 (or a parameter derived from the current $i_2$) by means of a comparator circuit. Normally $i_2 = -i_1 =$ $-k \cdot f_1$, wherein k is a constant. Certain faults in the polarity switch 6 may result in the condition $i_2 = -i_1$ no longer being fulfilled, so that the supervisory circuit 12 is activated.

In order to recognize such faults in the switch 6 also, which cause an interruption in the secondary winding of the current transformer 5, the two terminals of the secondary winding of the current transformer 5 are preferably connected to respective threshold switches 27 and 28. If the instantaneous value of the voltage on one of the terminals of the secondary winding of the current transformer 5 exceeds the threshold value $U_{s2}$ of the threshold switches 27 or 28, then the respective threshold switch is activated, and indicates a fault to the fault indicator 13.

In FIG. 3 there is shown a schematic circuit diagram of a supervisory circuit 29, in which the condition that $i_2 = -k \cdot f_1$ is supervised by means of a current-frequency transducer 30 connected to the terminal 9 of the switch 7, and by a comparator circuit operating as a frequency comparator. The output impulses of the current-frequency transducer 7 (frequency $f_1$) are fed to the forward-counting terminal F of a forward-backward counter 31, and the output impulses of the current-frequency transducer 30 (frequency $f_2$) are fed to the backward-counting terminal B of the forward-backward counter 31, which is in turn connected to a decoder 32 and a timer 33. The forward-backward counter 31 forms the difference between the impulses generated by the current-frequency transducer 7, and by the current-frequency transducer 30 during a preset measurement period determined by the timer 33. At the end of each measurement period the timer 33 releases the decoder 32. The decoder 32 indicates a fault signal to the fault indicator 13, to the extent that the contents of the forward-backward counter 31 exceed a predetermined value. Subsequently the timer 33 resets the forward-backward counter 33 to zero, and the aforedescribed process starts anew.

The measurement periods determined by the timer 33 may be constant, or dependent on the output, so that a limit for the permissible deviation of frequencies $f_1$ and $f_2$ may be constant, or dependent on the output. Where a constant limit is desired, the timer 33 may be a pulse generator of a constant time period, and where a limit dependent on the output is desired, an impulse counter may be used, which counts the impulses of the current-frequency transducer 7, and releases the decoder 32 after a predetermined impulse count has been reached, and then resets the forward-backward counter 31.

In FIG. 4 there is shown the schematic of a supervisory circuit 34, in which the frequencies $f_1$ and $f_2$ are transformed for subsequent comparison to voltages proportional to the respective frequencies. The terminal 9 (FIG. 1) of the polarity switch 6 is again connected to a second current-frequency transducer 35, and the current-frequency transducer 7 is connected to a frequency-voltage converter 36, while the current-frequency transducer 35 is connected to a frequency-voltage converter 37. A circuit consisting of two resistors 38 and 39, and a window comparator 40 serves as a comparator 65. The frequency-voltage converter 36, and the frequency-voltage converter 37 consist, in the example illustrated of a switch 41 and a switch 42, respectively. During the constant impulse duration of the impulses generated by the current-frequency converters 7 or 35, the respective switch connects the first terminal of the respective resistor 38 or 39 to the respective voltage source $+U_r$ or $-U_r$. The second terminal of said resistors 38 and 39 are connected to the junction of the input of the window comparator 40, and a capacitor 43 is connected between that junction and ground. The average value of the voltage across the switch 41 of 42 is proportional to the frequency $f_1$ or $f_2$, respectively. Across the capacitor 43 there appears a voltage proportional to the frequency difference $f_1-f_2$. The window comparator 40 indicates a fault to the fault indicator 13, if the voltage across the capacitor 43 exceeds, or falls below a positive or negative threshold value, respectively.

In FIG. 5 it is shown that the current-frequency transducer 35, and the frequency-voltage converter 37 (FIG. 4) may be omitted, and that the switch 16 (FIG. 1), and the reference voltage sources $+U_r$ and $-U_r$ may be components of the mark-space modulator 4. In FIG. 5 the same elements have been assigned reference numerals according to those in FIG. 1. The mark-space modulator 4 consists of resistors 44 and 45, an amplifier 46, a capacitor 47, a Schmitt-trigger 48, the switch 16, and of reference voltage sources $+U_r$ and $-U_r$. The voltage $U_1$ generates in the resistor 44 a current proportional to the input voltage U, which flows in the Miller-integrator consisting of an amplifier 46, and a capacitor connected between the input and output of the amplifier 46. The Schmitt-trigger 48 connected to the output of the Miller-integrator 46, 47 controls the switch 16, and the switch 6. In one position of the switch 16 the input of the Miller-integrator 46, 47 is connected by a resistor 45 to the reference voltage source $+U_r$, and in the other position it is connected to a reference voltage source $-U_r$.

A triangular waveform appears on the output of the Miller-integrator 46, 47, which periodically increases up to the upper threshold limit of the Schmitt-trigger 48, whereupon the Schmitt-trigger 48 reverses, causing the switch 16 to reverse, so that a reference current flowing through the resistor 45 to the Miller-integrator 46, 47 changes its direction, and the triangularly-shaped voltage falls to the lower threshold voltage of the Schmitt-trigger 48. The ratio of the difference to the sum of the mark duration and the space duration of the rectangular voltage at the output of the Schmitt-trigger 48, respectively, is proportional to the instantaneous value of the input voltage U.

As implemented in FIG. 1, the circuit according to FIG. 5, which consists of a resistor 18 and the secondary winding 3 of the voltage converter 1, is connected with one terminal to the switch 16, and with the other terminal to the input of the window comparator 15. The switch 16 and the reference voltage sources $+U_r$ and $-U_r$ therefore constitute, on one hand, a component of the mark-space modulator 4, and on the other hand form together the demodulator 14 of the supervisory circuit 66.

The current-frequency transducer 67 consists in the circuit, according to FIG. 5, of an amplifier 49 connected to the output 8 of the polarity switch 6, of a capacitor 50 connected between the input and output of the amplifier 48, of a threshold switch 51 connected to the output of the amplifier 49, of a timer 52 postcoupled to the threshold switch 51, of a switch 53 controlled by the timer 51, and of a resistor 54, which is connected, (in series with the switch 53,) with one of its terminals to the input of the amplifier 49, and with the other of its terminals to the reference voltage source $-U_r$.

The amplifier 49 and the capacitor 50 constitute a Miller-integrator, which forms the time integral of the current $i_1$. As soon as a threshold at the output of the Miller-integrator 49, 50 falls below the threshold value $U_{53}$ of the threshold switch 51, the threshold switch 51 reverses, the timer 52 generates an impulse having a duration $T_o$, the switch 53 is closed during the duration $T_o$, and through the resistor 54 the capacitor 50 is discharged, discharging a predetermined amount of energy, the threshold switch 51 subsequently reversing. This process is repeated at a frequency $f_1$.

A second supervisory circuit 55 of the schematic, according to FIG. 5, consists of an amplifier 56 connected to the output terminal 9 of the polarity switch 6, which amplifier together with a feedback resistor 57 forms a current-voltage transducer, of a switch 58 controlled by the timer 52 of the current-frequency transducer 7, of resistors 59 and 60, of a capacitor 61, and of a window comparator 62. The resistor 59 is connected in series with a switch 58 between the reference voltage source $-U_r$ and the input of the window comparator 62, the resistor 60 is connected between the output of the current-voltage transducer 56, and 57, and the input of the window comparator 62, and the capacitor 61 is connected between the input of the window comparator 62 and ground.

The average value of the current flowing in the resistor 59 is proportional to the frequency $f_1$, and the current flowing in the resistor 60 is proportional to the current $i_2$. The voltage across the capacitor 61 is zero, if the condition $i_2 = -k \cdot f_1$ is fulfilled. The window comparator 62 provides an error signal to the fault indicator 13 (FIG. 1), if the voltage across the capacitor 61 exceeds, or falls below a positive or negative threshold value, respectively. It is possible to omit the amplifier 56, and the resistors 57 and 60, and connect the terminal 9 of the switch 6 immediately to the input of the window comparator 62. The circuit is thereby simplified, but it is necessary to properly apportion the corresponding circuit values, so that the currents $i_1$ and $i_2$ are not influenced by any voltage appearing across the capacitor 61.

As shown in FIG. 6, the secondary winding 3 (FIG. 5) can be omitted, and the input of the window comparator 15 can be connected directly to the resistor 18, as well as via the resistor 63 to the secondary winding 2. Across the capacitor 19 there is then formed the difference between the output signal of the demodulator 14 and the current flowing in the resistor 63, which current is proportional to the voltage $U_1$.

If, as is shown in FIG. 5, the pair of reference voltage sources required for the mark-space modulator 4 is used for the supervision of this mark-space modulator 4, and the reference voltage source required for the current-frequency transducer 67 is used for the supervision of this transducer 67, then the cost of the supervisory circuits can be held at a particularly low level. The reliability of the supervision is increased, however, if separate reference voltage sources are used in the supervisory circuit. It is particularly advantageous if the current-frequency converter 67 is connected to, and supervised by means of the reference-voltage sources of the mark-space modulator 4, and if the mark-space modulator 4 is connected to, and supervised by means of the reference voltage sources of the current-frequency transducer 67.

The mark-space modulator 4 can also be supervised by an impulse counter instead of the supervisory circuit 20 of FIG. 2, wherein the impulse counter counts the impulses of an impulse generator, and is reset to zero by the periodic impulses of the mark-space modulator 4. If the oscillations of the mark-space modulator 4 cease, then the count of the impulse counter quickly reaches a predetermined limit value, which triggers an alarm.

We wish it to be understood that we do not desire to be limited to the exact details of construction shown and described, for obvious modifications will occur to a person skilled in the art.

Having thus described the invention what we claim as new and desire to be secured by Letters Patent is as follows:

1. In an electronic energy consumption meter having an alternating voltage input and an alternating current input, voltage-measurement means for forming a first signal proportional to said alternating voltage input, current measurement means including a current transformer having secondary winding means, for forming a second signal proportional to said alternating current input, mark-space modulator means controlled by one of said signals generating a substantially rectangular waveform, amplitude modulator means including a polarity switch and having a first and a second output and being controlled by the other of said signals for modulating said substantially rectangular waveform, current-frequency transducer means being coupled to said secondary winding means of said current transformer through said polarity switch and being coupled to said amplitude modulator means and generating impulses, and impulse counter means for counting the impulses generated by said current-frequency transducer means, in combination, first supervisory circuit means coupled to, and supervising, said mark-space modulator means, second supervisory circuit means coupled to, and supervising, at least said current-frequency transducer means, said second supervisory circuit means including comparison means for comparing at least a value derived from the output frequency of said current frequency transducer means with at least a parameter derived from the current flowing in said secondary output of said amplitude modulator means, and fault indicator means coupled to the output of each of said supervisory circuit means for indicating a fault in said meter.

2. A meter as claimed in claim 1, wherein said first supervisory circuit means includes voltage-doubling means postcoupled to said mark-space modulator means, and threshold switch means postcoupled to said voltage-doubling means.

3. A meter as claimed in claim 1 wherein said voltage-measurement means generates a third signal proportional to said alternating voltage input, and said first supervisory circuit means includes demodulator means postcoupled to said mark-space modulator means, comparator means for comparng an output signal of said demodulator means with said third signal, and window-comparator means postcoupled to comparator means.

4. A meter as claimed in claim 3, wherein said demodulator means includes switch means controlled by said mark-space modulator means, and further comprising a positive reference voltage source and a negative reference voltage source operatively alternately connected to said comparator means.

5. A meter as claimed in claim 4, wherein said mark-space modulator means comprise said switch means and said reference voltage sources.

6. A meter as claimed in claim 4, wherein said voltage-measurement means further comprises transformer means having a first secondary winding coupled to said mark-space modulator means, and comparator means having a first terminal thereof connected through said switch means to said reference voltage sources, and a second terminal thereof connected to said window-comparator means.

7. A meter as claimed in claim 6, wherein said comparator means includes a resistor and a second secondary winding of said transformer means.

8. A meter as claimed in claim 1, wherein said current-measurement means includes a current transformer having secondary winding means, and said amplitude modulator means includes a polarity switch and has an output, said current-frequency transducer means being coupled to said secondary winding means of said current transformer through said polarity switch, and being coupled to said output of said amplitude modulator means, and wherein said second supervisory circuit means includes comparison means for comparing at least a value derived from the output frequency of said current-frequency transducer means with at least a parameter derived from the current flowing in said second output of said amplitude modulator means.

9. A meter as claimed in claim 1 or 8, wherein said value derived from the output frequency of said current-frequency transducer means includes said output frequency, and wherein said parameter derived from the current flowing in said second output of said amplitude modulator means includes said current.

10. A meter as claimed in claim 1 or 8, further comprising an other current-frequency transducer means, and wherein said amplitude modulator means has an other output connected to said other current-frequency transducer means, and wherein said comparison means includes frequency comparison means.

11. A meter as claimed in claim 1 or 8, wherein said current-frequency transducer means includes first and second current-frequency transducers, and wherein said amplitude modulator means has an other output connected to said second current-frequency transducer and further comprising frequency-voltage converter means including first and second frequency-voltage converters connected to said first and second current-frequency transducers, respectively, and wherein said comparison means includes current comparison-means and window comparison-means postcoupled to said current comparison-means.

12. A meter as claimed in claim 1 or 8, wherein said amplitude modulator means has an other output, and further including current-voltage converter means connected to said other output of said amplitude modulator means, and frequency-current converter means connected to said current-frequency transducer means, and wherein said comparison means includes current comparison means and window comparison means postcoupled to said current comparison means.

13. A meter as claimed in claim 11, further comprising reference voltage-source means coupled to said frequency-voltage converter means, a timer connected to said current-frequency transducers, said frequency-voltage converter means including control switch means controlled by said timer.

14. A meter as claimed in claim 1 or 8, wherein said secondary winding means of said current-measuring means includes first and second windings, and further comprising first and second threshold switches connected to said first and second windings, respectively.

15. A meter as claimed in claim 1, further comprising first reference voltage source means connected to said mark-space modulator means, and second reference voltage source means connected to said current-frequency transducer means.

16. A meter as claimed in claim 15, wherein said first reference voltage source is connected to said current-frequency transducer means, and said second reference voltage source means is connected to said mark-space modulator means.

17. A fault indicator circuit for use in connection with an electronic energy consumption meter to indicate a fault therein, said meter having an alternating voltage input and an alternating current input, and voltage-measurement means for forming a first signal proportional to said alternating voltage input, current-measurement means including a current transformer having secondary winding means, for forming a second signal proportional to said alternating current input, mark-space modulator means controlled by one of said signals, generating a substantially rectangular waveform, amplitude modulator means including a polarity switch and having a first and a second output and being controlled by the other of said signals, for modulating said substantially rectangular waveform, current-frequency transducer means being coupled to said secondary winding means of said current transformer through said polarity switch and being coupled to said amplitude modulator means, and generating impulses, and impulse counter means for counting the impulses generated by said current-frequency transducer means, said fault indicator circuit comprising first supervisory circuit means couplable to said mark-space modulator means for the supervision thereof, second supervisory circuit means couplable to at least said current-frequency transducer means for the supervision thereof, said second supervisory circuit means including comparison means for comparing at least a value derived from the output frequency of said current-frequency transducer means with at least a parameter derived from the current flowing in said secondary output of said amplitude modulator means and fault indicator means coupled to the output of said supervisory circuit means for indicating a fault in said meter.

18. A fault indicator circuit for use in connection with an electronic energy consumption meter to indicate a fault therein, said meter having an alternating voltage input and an alternating current input, and voltage-measurement means for forming a first signal and a third signal both of said signals being proportional to said alternating voltage input, current-measurement means for forming a second signal proportional to said alternating current input, mark-space modulator means controlled by one said signals, generating a substantially rectangular waveform, amplitude modulator means controlled by the other of said signals, for modulating said substantially rectangular waveform, current-frequency transducer means coupled to said amplitude modulator means, and generating impulses, and impulse counter means for counting the impulses generated by said current-frequency transducer means, said fault indicator circuit comprising first supervisory circuit means couplable to said mark-space modulator means for the supervision thereof, said first supervisory circuit means including demodulator means coupled to said mark-space modulator means, comparator means for comparing an output signal of said demodulator means with said third signal, and window-comparator means coupled to said comparator means;

second supervisory circuit means couplable to at least said current-frequency transducer means for the supervision thereof, and fault indicator means coupled to the output of said supervisory circuit means for indicating a fault in said meter.

19. In an electronic energy consumption meter having an alternating voltage input and an alternating current input, voltage-measurement means for forming a first signal and a third signal of said signals both of said signals being proportional to said alternating voltage input, current-measurement means for forming a second signal proportional to said alternating current input, mark-space modulator means controlled by one of said signals, generating a substantially rectangular waveform, amplitude modulator means controlled by the other of said signals for modulating said substantially rectangular waveform, current-frequency transducer means coupled to said amplitude modulator means and generating impulses, and impulse counter means for counting the impulses generated by said current-frequency transducer means, in combination, first supervisory circuit means coupled to, and supervising said mark-space modulator means, said first supervisory circuit means including demodulator means coupled to said mark-space modulator means, comparator means for comparing an output signal of said demodulator means with said third signal, and window-comparator means coupled to said comparator means;

second supervisory circuit means coupled to, and supervising at least said current-frequency transducer means, and fault indicator means coupled to the output of each of said supervisory circuit means for indicating a fault in said meter.

* * * * *